United States Patent [19]

Herman et al.

[11] 4,399,449

[45] Aug. 16, 1983

[54] COMPOSITE METAL AND POLYSILICON FIELD PLATE STRUCTURE FOR HIGH VOLTAGE SEMICONDUCTOR DEVICES

[75] Inventors: Thomas Herman, Redondo Beach; Alexander Lidow, Manhattan Beach, both of Calif.

[73] Assignee: International Rectifier Corporation, Los Angeles, Calif.

[21] Appl. No.: 207,124

[22] Filed: Nov. 17, 1980

[51] Int. Cl.³ ............................................. H01L 29/40
[52] U.S. Cl. ...................................... 357/53; 357/54; 357/59; 357/73; 357/23
[58] Field of Search ....................... 357/73, 52, 53, 54, 357/55, 59, 23 VD

[56] References Cited

U.S. PATENT DOCUMENTS

| | | | |
|---|---|---|---|
| T953,005 | 12/1976 | Anantha et al. | 357/53 |
| T964,009 | 11/1977 | Chiu et al. | 357/53 |
| 3,518,494 | 6/1970 | James | 357/53 |
| 3,609,473 | 9/1971 | Bittmann et al. | 357/53 |
| 3,811,076 | 5/1974 | Smith | 357/53 |
| 3,977,019 | 8/1976 | Matsushita et al. | 357/52 |
| 4,009,483 | 2/1977 | Clark | 357/52 |
| 4,062,040 | 12/1977 | Abbas et al. | 375/53 |
| 4,080,619 | 3/1978 | Suzuki | 357/53 |
| 4,219,834 | 8/1980 | Esch et al. | 357/53 |

FOREIGN PATENT DOCUMENTS

| | | | |
|---|---|---|---|
| 2422912 | 12/1974 | Fed. Rep. of Germany | 357/53 |
| 2457746 | 6/1976 | Fed. Rep. of Germany | 357/53 |
| 2309983 | 11/1976 | France | 357/52 |
| 55-86146 | 6/1980 | Japan | 357/53 |

OTHER PUBLICATIONS

C. Jambotkar, "Spaced Field Plate for Increasing Planar Jcn. Breakdown Volt.," IBM Tech. Discl. Bull., vol. 19, #2, Jul. 1976, pp. 478, 479.
H. Gates, "Encap. for Semi. Dev.," IBM Tech. Discl. Bull., vol. 8, #11, Apr. 1966, p. 1687.

*Primary Examiner*—Joseph E. Clawson, Jr.
*Attorney, Agent, or Firm*—Ostrolenk, Faber, Gerb & Soffen

[57] ABSTRACT

A field plate structure is provided to terminate the electrode of a semiconductor device in a manner to reduce curvature of electric field within the body of the semiconductor device underlying the electrode and surrounding the electrode. A stepped electrode outer rim is provided in effect through the use of an underlying polysilicon which drapes over an underlying oxide. The main contact metal, typically aluminum, overlies the polysilicon but is upwardly displaced above the relatively thin polysilicon by a relatively thick oxide layer over the polysilicon. The composite effect of the thin polysilicon layer at one level and the heavier metallizing at a higher level but overlapping the polysilicon is that of a metal electrode deposited atop an insulation layer having two steps therein.

16 Claims, 19 Drawing Figures

COMPOSITE METAL AND POLYSILICON FIELD PLATE STRUCTURE FOR HIGH VOLTAGE SEMICONDUCTOR DEVICES

RELATED APPLICATIONS

This application is related to copending applications Ser. No. 38,662, filed May 14, 1979, in the name of Alexander Lidow et al, entitled PLURAL POLYGON SOURCE PATTERN FOR MOSFET, now abandoned, and its continuation application Ser. No. 243,544, filed Mar. 13, 1981; Ser. No. 178,689, filed Aug. 18, 1980, in the name of Alexander Lidow et al, entitled PROCESS FOR MANUFACTURE OF HIGH POWER MOSFET WITH LATERALLY DISTRIBUTED HIGH CARRIER DENSITY BENEATH THE GATE OXIDE; Ser. No. 207,123, filed Nov. 17, 1980, in the name of Thomas Herman et al, entitled IMPROVED PLANAR STRUCTURE FOR HIGH VOLTAGE SEMICONDUCTOR DEVICES; and Ser. No. 207,126, filed Nov. 17, 1980, in the name of Alexander Lidow, entitled FLOATING GUARD REGION AND PROCESS OF MANUFACTURE FOR SEMICONDUCTOR SWITCHING DEVICE USING SPACED MOS TRANSISTORS HAVING A COMMON DRAIN REGION, all of which are assigned to the assignee of the present invention.

BACKGROUND OF THE INVENTION

This invention relates to a field plate structure for high voltage semiconductor devices, and more specifically relates to a combined field plate structure which minimizes the curvature of the electric field in a semiconductor body in regions below the rim of the field plate.

It is well known that relatively high electric field stress is produced in the body of a semiconductor device if the main electrode of the device is sharply terminated. This is because the electric field lines curve sharply at regions underlying the outer periphery of the field plate, and limit the ability of the device to withstand reverse voltage.

The curvature of the electric field lines has been controlled in the past by guard rings which encircle the outer periphery of the device and by field plates which are extensions of the device electrodes, but are spaced from the semiconductor substrate as by overlying a silicon dioxide layer on the semiconductor surface. This will then reduce the curvature of the electric field lines beneath the contact area of the electrode, although the electric field lines still can bend fairly sharply beneath the outermost periphery of the stepped field plate. To reduce this effect, it is also known to provide a second step in the field plate, but this requires the formation of a step in the oxide which supports the field plate and defines its shape. The provision of a step in the oxide requires additional complex processing steps.

BRIEF DESCRIPTION OF THE INVENTION

In accordance with the present invention, a novel composite field plate is provided using a combination of an underlying polysilicon layer and an overlying extension of the main electrode. The underlying polysilicon is electrically connected or capacitively coupled to the main electrode and overlies a surrounding oxide layer to define a first upward step level for the main electrode. The upper surface of the polysilicon is then coated with an oxide layer or other layer to increase its thickness and the main contact member is then caused to overlie the oxide above the polysilicon. As a result, the composite polysilicon and main contact member, which extends beyond the outer periphery of the polysilicon, define, so far as the electric field in the underlying semiconductor substrate is concerned, a multi-step field plate which minimizes the curvature of the electric field within the semiconductor body, thus increasing the ability of the device to withstand high reverse voltage.

Note that the effect of more than two steps could also be produced.

In addition to the novel composite polysilicon and metal field plate which defines a multi-step field plate, there is also provided a floating guard ring which is normally used independently of a field plate. However, the combination of the floating guard ring with the field plate produces exceptionally good reverse-voltage characteristics and permits the device to withstand close to the theoretical maximum reverse voltage. Note that in a typical process which employs polysilicon as well as conventional metallizing, the novel composite polysilicon and metal field plate can be produced without requiring additional processing steps.

DETAILED DESCRIPTION OF THE DRAWINGS

Figure 1:
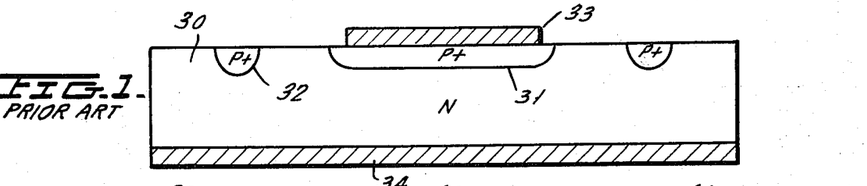
FIG. 1 is a cross-sectional view of a typical planar diode employing a prior art type of guard ring which extends around its outer periphery to increase the reverse voltage capability of the device.
Figure 2:
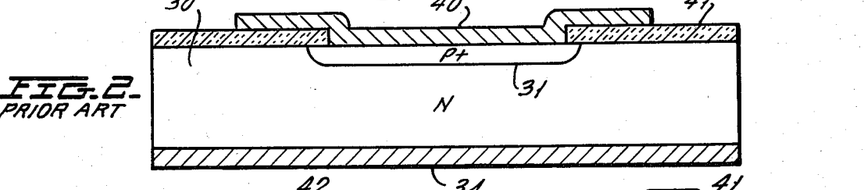
FIG. 2 shows a diode such as that of FIG. 1 where a field plate is employed to improve the reverse voltage characteristics of the device.
Figure 3:
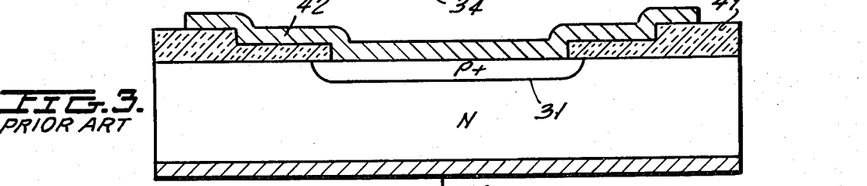
FIG. 3 shows a further prior art arrangement wherein the field plate metal of FIG. 2 is caused to step over a corresponding step in an underlying oxide in order to improve the field distribution at the surface of the device.
Figure 4:
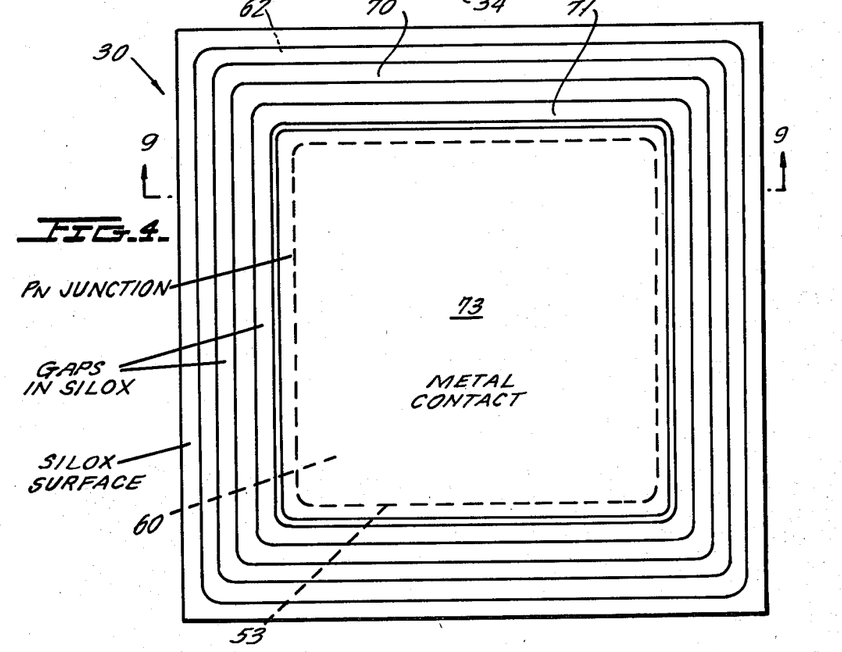
FIG. 4 is a top view of chip which contains a planar diode covered with a silox layer which is gapped in accordance with the disclosure herein.
Figure 9:
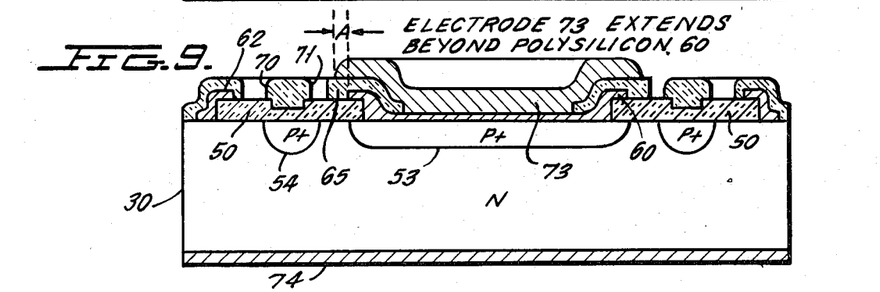
FIG. 9 is a cross-sectional view of the device of FIG. 8 and is a cross-section of FIG. 4 taken across the section line 9—9 in FIG. 4 showing a completed chip after electrodes are metallized on the chip to form a combined field plate with multiple steps.

FIGS. 1, 2 and 3 show prior art arrangements which have been used for improving the reverse high voltage performance of planar semiconductor devices shown for the example of a diode in FIGS. 1, 2 and 3. As will be later described, one aspect of the novel invention, as shown in FIGS. 4 and 9, combines the features of FIGS. 1, 2 and 3 with a silox layer which has gaps to improve the high voltage performance of the ultimate device. The novel structure of FIGS. 4 and 9 will also be seen to incorporate a novel composite metal and polysilicon field plate structure which has the characteristics of the doubly stepped field plate shown in FIG. 3 without the processing complexity which is required for the device of FIG. 3.

Referring first to FIG. 1, there is shown a cross-section of a chip of semiconductor material 30 which can be monocrystalline silicon which could, for example, have a thickness of 14 mils and could have a rectangular configuration (or any other geometric shape) where the rectangle could be one having dimensions of 100 mils by 100 mils.

The device can be formed simultaneously with the processing of a large number of devices in a common wafer in the usual manner, where the devices are later separated from the wafer by conventional etching or other breaking-away techniques.

Similarly, in each of the embodiments of the invention to be described, all the devices can be made either on a single wafer or a plurality of devices can be formed in individual chips which are subsequently broken out of the wafer.

The wafer 30 of FIG. 1 can consist of monocrystalline silicon of the N conductivity type and can have an N- epitaxial layer deposited atop the N type body. All junctions are formed in the epitaxial layer in the usual manner. Note, however, that the invention can be carried out in a chip which does not use an epitaxial layer.

In FIG. 1, a planar diode is formed by a P+ layer 31 which may be diffused into the upper surface of the chip 30. At the same time the P+ layer 31 is diffused, a P+ ring 32 is formed around the outer periphery of the upper surface of the device to serve as a conventional guard ring. Upper and lower electrodes 33 and 34, which can be of any desired material, can be secured to the chip in the usual manner. Contact metals may be placed on electrodes 33 and 34, if necessary, so that the device can be easily assembled into a suitable casing. Note that while the embodiments herein are described using an N-type substrate which receives P type diffusions, the initial body could have been of the P type and the diffusion impurities could have been of the N type.

The guard ring 32 is well known and serves to improve the reverse voltage capability of the device by causing the electric field lines produced beneath the P+ region 31 during reverse bias to extend laterally outwardly and reduce the sharpness of curvature of field lines within the bulk of the chip. The P+ guard ring 32 also tends to spread out the electric field lines to reduce local electric field stress along the upper surface of the device.

A plurality of spaced guard rings, such as guard ring 32, have also been used to improve the redistribution of the electric field in the silicon body during reverse bias.

A field plate will also tend to reduce the electric field in the silicon body during reverse bias. A typical diode employing a field plate is shown in FIG. 2. In FIG. 2, the device is basically similar to the one of FIG. 1 except that, in place of the guard ring 32, the upper metallizing 40, which can be metal such as aluminum, a doped polysilicon, or a metal silicide, overlaps a silicon dioxide ring 41 or a ring of other insulation material. The enlarged area of contact 40 forces the electric field lines within the body 30 and below P+ region 31 to spread out radially beyond the outer periphery of electrode 40, thus reducing the curvature of the electric field lines within the body of the device and improving the device characteristics under reverse bias.

The main function of the guard ring 32 in FIG. 1 and of the field plate 40 in FIG. 2 is to spread the depletion region as far out as possible during reverse bias. It is curvature in this depletion region which is primarily responsible for premature breakdown of the semiconductor device. The curvature of the electric field can be further minimized by the arrangement shown in FIG. 3 which is similar to FIG. 2 except the oxide 41 contains a step 42 therein which causes the metallizing 40 to have a corresponding and second step. An arrangement of this type is disclosed by F. Conti and M. Conti at pages 92 to 105 of SOLID-STATE ELECTRONICS, 1972, Volume 15.

By stepping the field plate over the two different thicknesses of oxide as in FIG. 3, the device will have increased ability to withstand breakdown voltage because of the minimized curvature in the electric field by the stepped field plate. The processing of the device of FIG. 3 to have a step in the oxide layer, however, is relatively complex. In accordance with an aspect of the present invention, the effect of a stepped field plate as shown in FIG. 3 is obtained by a novel combined composite metal and polysilicon field plate structure which further incorporates a guard ring. The assembly is then coated with silox which is slotted to minimize polarization effects in the silox from further distorting the electric field lines in the semiconductor body which underlies the silox.

A novel diode formed in accordance with the invention is shown in FIGS. 4 and 9. The processing steps leading to the device of FIGS. 4 and 9 are shown in FIGS. 5 to 8.

To process the device of FIGS. 4 and 9, individual chips of a common wafer are identically processed and may have dimensions of 100 mils by 100 mils. The chip may be an N type chip having a thickness of about 14 mils.

If desired, the chip can have an epitaxially formed upper layer which is lightly doped and will receive all junctions.

Figure 5:
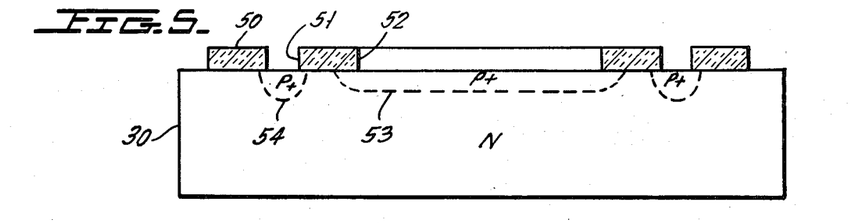
FIG. 5 is a cross-sectional view of the chip of FIG. 4 at an initial stage in its manufacture.

The first step in the process is the coating of the individual chips with an oxide coating 50 which may have a thickness of 1.3 microns.

Thereafter, and using photolithographic techniques, the oxide coating 50 in FIG. 5 has windows 51 and 52 formed therein, wherein the window 51 is a groove enclosing the outer periphery of the device. The chip is then placed in an appropriate diffusion furnace and any suitable impurity, such as boron, is diffused into the windows at a suitable temperature and for a suitable time to define a central P+ region 53 surrounded by a P+ guard ring 54. The temperature and time selected for the process will be determined by the desired depth and concentration of the P+ diffusion selected by the designer. Note that in this embodiment and in all subsequent embodiments, the conductivity type selected for the devices can be reversed and in FIG. 5 the wafer 30 could have been a P+ body type wafer the diffusions could have been N type phosphorus diffusions.

After the formation of the P+ regions 53 and 54 in FIG. 5, the wafer or chip is coated with polysilicon which is degeneratively doped to be very conductive. The polysilicon layer 60 is formed to a thickness, for example, of 0.5 micron.

Figure 6:
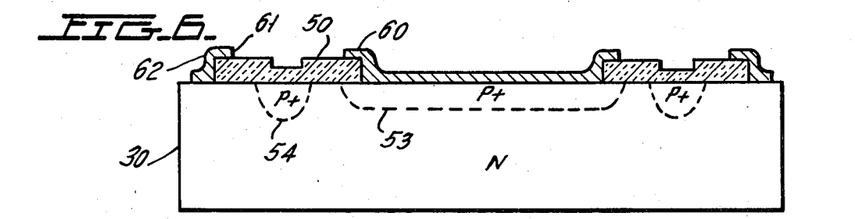
FIG. 6 shows the chip of FIG. 5 at a further stage of manufacture, wherein a field plate metallizing surface is applied to the device.

Note that a shell of polysilicon material 60 overlies the oxide ring 50 in the manner of the field plate of FIG. 2. Thereafter, a second mask is applied to the device and, through the use of suitable photolithographic techniques, an annular window 61 is etched in the polysilicon layer 60 to define a central region which contacts the P+ region 53 and an outer guard ring region 62 which encircles the periphery of the device.

Figure 7:
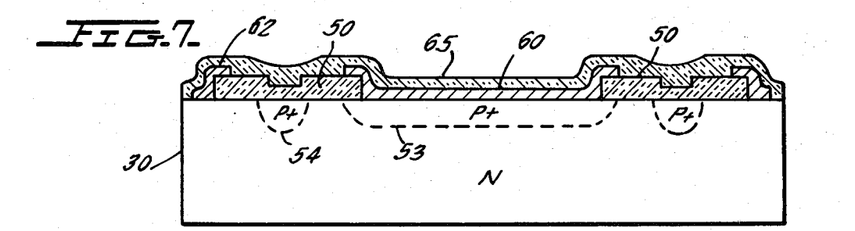
FIG. 7 shows the chip of FIG. 6 after the formation of a reflowed silox layer.

The next step in the process is shown in FIG. 7 and is the deposition of a layer 65 of phosphorus-doped silicon dioxide or silox, where the phosphorus can, for example, be 8% by weight of the silicon dioxide. The phosphorus doped silicon dioxide layer 65 is deposited to a thickness of 1.0 micron. The wafer is thereafter placed in a furnace and heated, for example, to a temperature of 900° C. for 60 minutes so that the silox reflows and forms a smooth glassy cover over the entire upper surface of the device.

Figure 8:
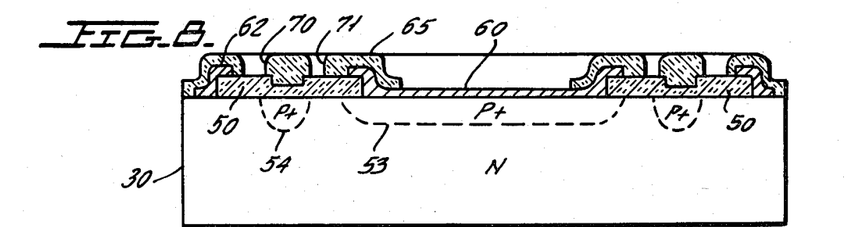
FIG. 8 shows the wafer of FIG. 7 after two series gaps are etched in the silox layer.

Thereafter, and as shown in FIG. 8, a further mask is applied to the device and, through the use of photolithographic techniques, two annular gaps 70 and 71 are formed in the silox coating 65 to a depth which exposes the underlying oxide 50.

Thereafter and as shown in FIG. 9, a contact plate, such as the aluminum contact plate 73, is deposited atop the polysilicon layer 60 and overlies the outer edge of the polysilicon layer 60. In FIG. 9, electrode 73 extends beyond the polysilicon 60 by a radial distance A. As an example, the polysilicon 60 can have a lateral dimension of 100 mils by 100 mils and can be overlapped by 2.0 mils, equal to the dimension A by the electrode 73.

The final device shown in FIGS. 4 and 9 can also be provided with metallizing 74 on its bottom surface (FIG. 9) to serve as a heat sink when the device is mounted in any suitable housing.

The device of FIGS. 4 and 9 has several advantages over prior art devices and can withstand higher reverse voltages than prior art devices.

It is first noted that the device combines the use of a floating P+ ring 54 of FIG. 1, with the overlapping field plate structure, including the field plate defined by the polysilicon layer 60 which overlies the oxide layer 50 as in FIG. 2. Moreover, the effective field plate structure of FIGS. 4 and 9 is electrically identical to that of FIG. 3 which required a step 42 in the oxide but is produced with a simpler manufacturing process. More specifically, in FIG. 9, the metallizing 73 overlies the edge of the polysilicon 60, thereby to define a composite metal and polysilicon field plate which controls the electric field within the silicon body 70 like the stepped electrode 40 of FIG. 3. Thus, the two electrodes 60 and 73 are electrically connected together in the central regions of the device, and the effect on electric fields within the device will be to reduce their curvature in the same manner as the continuous stepped metal electrode 40 of FIG. 3. Consequently, the novel composite polysilicon and metal electrode including the polysilicon layer 60 and electrode 73 are simply formed structures which are made using other steps necessary for the manufacturing process and minimize the curvature of electric fields beneath the electrode and in the silicon body.

A further important feature of this application is the provision of the gaps 70 and 71 in the silox layer 65. As was previously described, in order to make the silox such that it will reflow easily to form a good glassy sealing surface over the exposed surfaces of the device, phosphorus is added to the glass. The addition of phosphorus or other equivalent materials, however, renders the silox polarizable. Because it is polarizable, a high lateral field will cause polarization in the silox which can interfere with the distribution of the electric fields within the bulk of wafer 30 and at the surface of the wafer or chip 30. As a result, the high voltage performance of the device is degraded.

The gaps 70 and 71, particularly in the region of the guard ring 54, will act to minimize polarization effects at the relatively highly stressed regions such as the regions on opposite sides of the P+ region 54.

The novel arrangement described in connection with FIGS. 4 through 9 for the diode, including the composite field plate structure and the provision of gaps in the silox layer adjacent highly stressed regions of the device, can be used in virtually any type of high voltage planar semiconductor device.

FIGS. 10 through 15 illustrate the application of the invention to a MOSFET device of the general type set forth in copending application Ser. No. 178,689. Copending application Ser. No. 178,689 discloses a detailed process for the manufacture of a high power MOSFET device and those details of manufacture can be used in making the device of FIGS. 11 through 15. The subject matter of the said application is incorporated herein by reference.

Figures 10, 11:
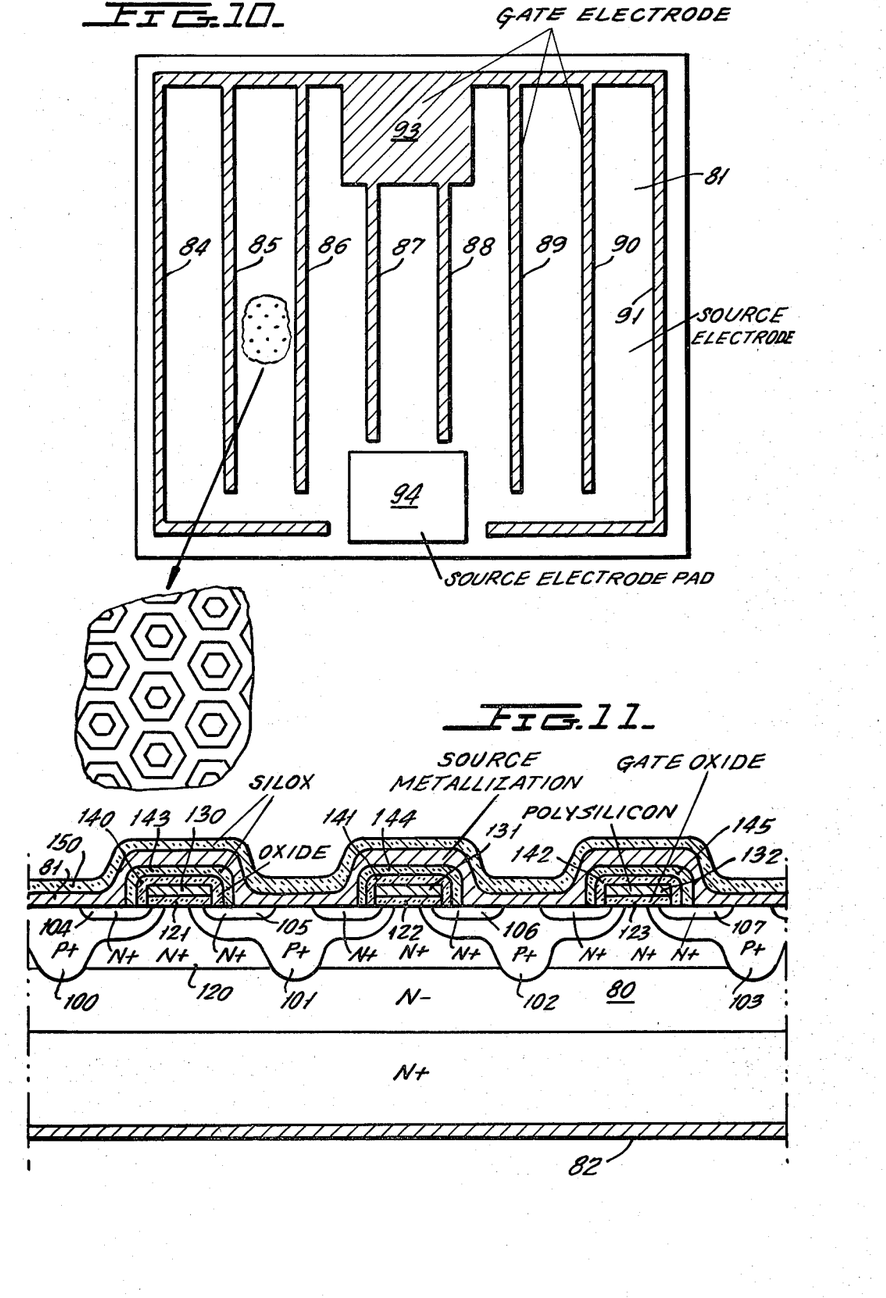
FIG. 10 is a top view of a second embodiment of the invention illustrating the invention as applied to a MOSFET device.
FIG. 11 is a cross-sectional view through a small section of the source regions of FIG. 10 to illustrate the configuration of the region junctions.
Figure 14:
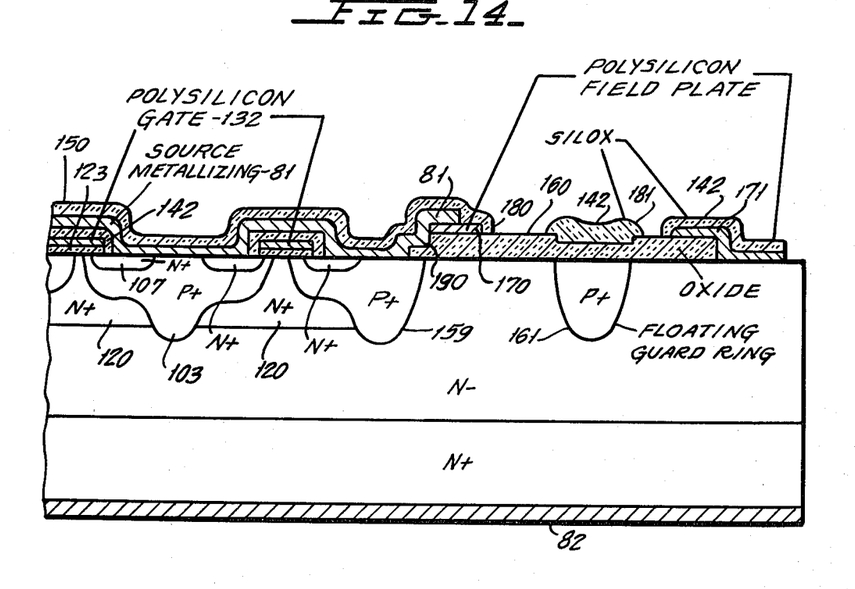
FIG. 14 is a cross-sectional view of FIG. 13 taken across the section line 14—14 and further illustrates the silox gaps.

The chip defining the device is shown in plan view in FIG. 10 and can be a chip having dimensions, for example, of 100 mils by 100 mils, with the wafer thickness as shown in FIGS. 11 and 14 of about 14 mils. The wafer used to manufacture the high power MOSFET of FIGS. 10 and 11 is preferably one of N type material having an N-epitaxially deposited layer 80 having a thickness of 35 microns.

As seen in FIG. 10, the device consists of an overlying source electrode 81 which can consist of an aluminum sheet which will be later seen to be connected to a plurality, for example, 6000 hexagonal MOSFET cells.

Each of the source cells (a few are shown in enlarged view in FIG. 10 and in FIG. 13) passes current through respective channels to be described to a common bottom drain electrode 82 (FIGS. 11 and 14).

A main gate electrode 93 is provided which has a plurality of radiating fingers, such as the fingers 84 to 91 (FIG. 10) which are connected to a polysilicon gate grid 92 (FIG. 12) which overlies a gate oxide which controls pairs of underlying channels. Electrical connection to the gate electrode is made at the enlarged gate pad 93. Similarly, connection to the source electrode 81 is made at the source connection pad 94.

Typical cells are best seen in FIG. 11 and consist of respective hexagonally shaped P type diffusions 100 to 103 which P type diffusions can respectively have diameters of about 1 mil. The particular shape of the P type diffusions is described in detail in copending applications Ser. No. 178,689 and Ser. No. 243,544.

Each of the P type regions 100 through 103, which are hexagonal in configuration, contain respective hexagonal N+ channels such as the channels 104, 105, 106 and 107, respectively, which are the source regions for each of the cells. Each of the cells 100 through 103 is embedded in a shallow N+ region 120 which has a depth, for example, of about 1 micron. The thin hexagonal region disposed between the outer periphery of source regions 104 through 107 and the N+ region 120 surrounding them define respective channels which can be inverted by application of a suitable gate voltage atop the gate oxide above these channels.

Thus, as shown in FIG. 11, a hexagonal grid of silicon dioxide including legs 121, 122 and 123 in FIG. 11 overlie the channels defined in two opposing legs of opposing hexes as shown. The oxide grid including the legs 121, 122 and 123 then has corresponding segments of the polysilicon gate grid 92 of FIG. 12 overlying the oxide. Thus, in FIG. 11, polysilicon legs 130, 131 and 132 of grid 92 of FIG. 12 overlie the respective oxide legs 121, 122 and 123.

Figure 12:
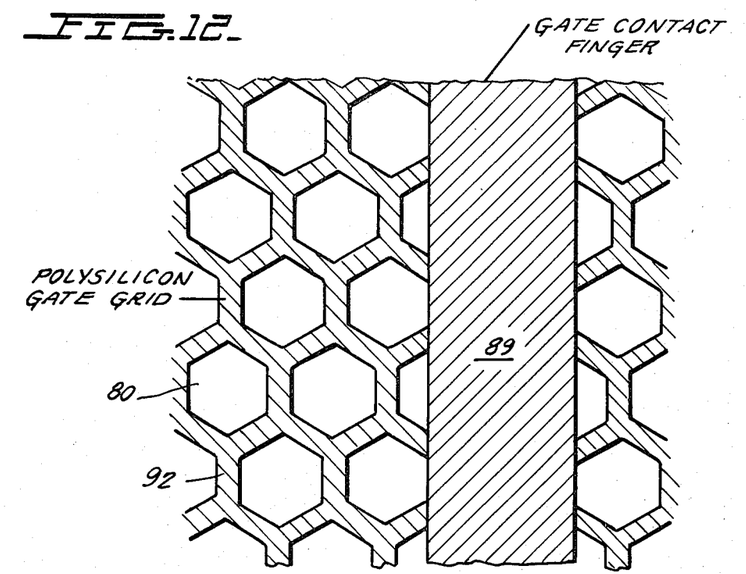
FIG. 12 is a top view of the device of FIGS. 10 and 11, illustrating the manner in which the gate fingers contact the polysilicon grid which defines a gate electrode.
Figure 13:
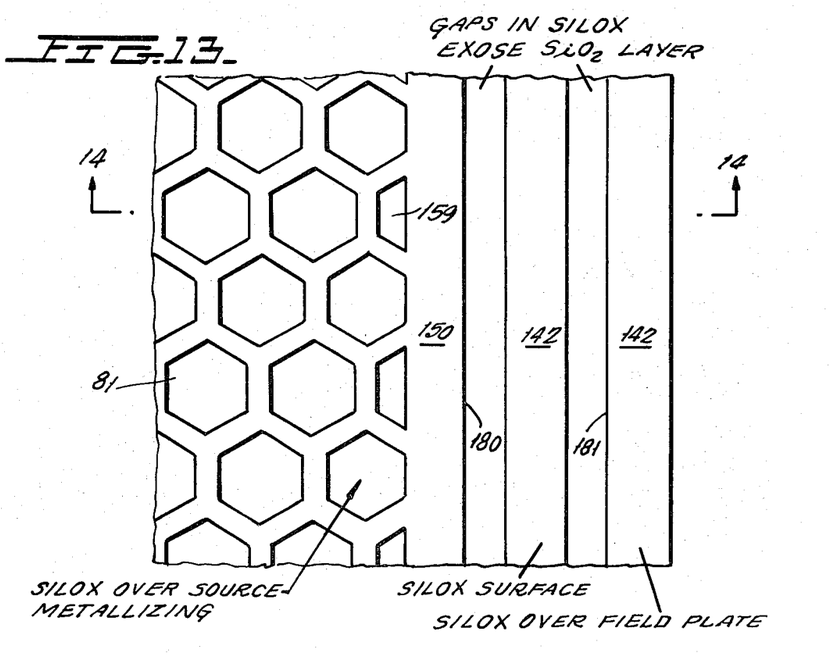
FIG. 13 is an enlarged view of an edge region of the device of FIG. 10 and illustrates the manner in which gaps are formed in the silox overcoating.

Electrical contact is made between the gate electrode fingers and the polysilicon gate grid in the manner shown in FIG. 12 where the gate contact finger directly overlies and contacts the polysilicon gate grid. Note that the contact fingers of the gate electrode will be suitably insulated from the adjacent source electrode 81 by appropriate spacing and by appropriate oxide insulation.

As further shown in FIG. 11, the polysilicon gate grid is covered by an oxide layer including oxide sections 140, 141 and 142 over the polysilicon grid sections 130, 131 and 132, respectively. These are in turn covered by a reflowed silox layer having a relatively high phosphorus concentration, and which includes sections 143, 144 and 145. Note that the silox and oxide layers just described are removed at areas where contact is to be made between the gate contact finger and the polysilicon gate grid.

The silox is then covered directly by the source metallizing 81 and by a further silox layer 150 which is not reflowed and has a relatively low phosphorus concentration.

FIG. 14 illustrates the pattern of the device at its edge and shows the last P+ element 103 of FIG. 11 at the left-hand end of FIG. 14 The last cell portion in the string is the half-cell portion 159 (see FIG. 13) through which the section is taken. The edge of the device contains a silicon dioxide layer 160 which overlies a P+ floating guard ring 161 in a manner reminiscent of that of FIGS. 4 and 9.

The outer periphery of the device contains a polysilicon field plate 170 which encircles the periphery and assists in terminating the source metallizing 81 which overlies field plate 170. The outer periphery also includes an outermost polysilicon field plate 171 which overlies the outer edge of the silicon dioxide layer 160 and makes contact with the substrate 80 and thus is connected to the drain 82.

In the device shown best in FIG. 14, there is a high electric field produced at the outer periphery of the device during reverse-voltage conditions. The curvature of this field is minimized by the floating guard ring 161 and by the use of the polysilicon field plates 170 and 171. The field produced in the highly doped silox layer 142 could cause the silox to polarize and thus interfere with the electric field distribution pattern.

In accordance with an important aspect of the invention, the highly doped silox layer 142, which may be simultaneously deposited with layer 150, is provided with two annular gaps, such as the gaps 180 and 181, thereby to expose the surface of silicon dioxide layer 160 which is not subject to polarization effects.

Figure 15:
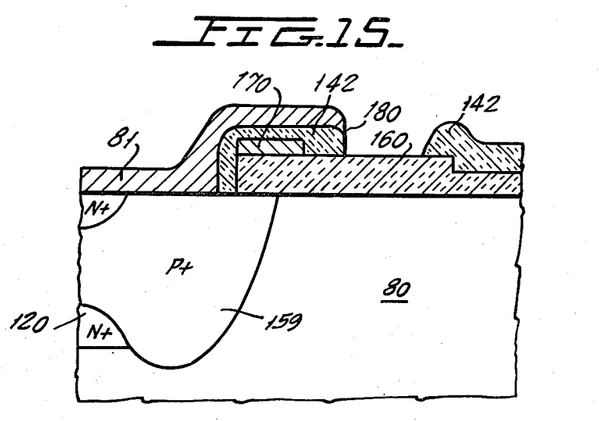
FIG. 15 is an enlarged view of a second embodiment of the field plate of FIG. 14.

The novel composite polysilicon and metallizing field plate can also be used in the MOSFET device of FIGS. 11 to 14 as is best shown in FIG. 15. Thus, in FIG. 15, there is disclosed a modification of the arrangement shown in FIG. 14 for terminating the source metallizing 81.

Referring to FIG. 15, where components similar to those of FIG. 14 have the same identifying numerals, the polysilicon field plate 170 can be covered with an extension of the silox 142 as illustrated. The metallizing 81 can then extend over the silox covering 142 as illustrated, thereby to define an effective field plate step which will minimize the curvature of the electric field in the silicon body 80 without relying on a step such as the step 190 in the oxide 160 in FIG. 14 to obtain this result.

FIGS. 16 through 19 illustrate a still further embodiment of the invention as applied to a TRIMOS type device. A TRIMOS type device is a semiconductor switching device using spaced MOS transistors having a common drain region. The device is described in U.S. Pat. No. 4,199,774 in the name of James B. Plummer, entitled *MONOLITHIC SEMICONDUCTOR SWITCHING DEVICE*.

Figure 16:
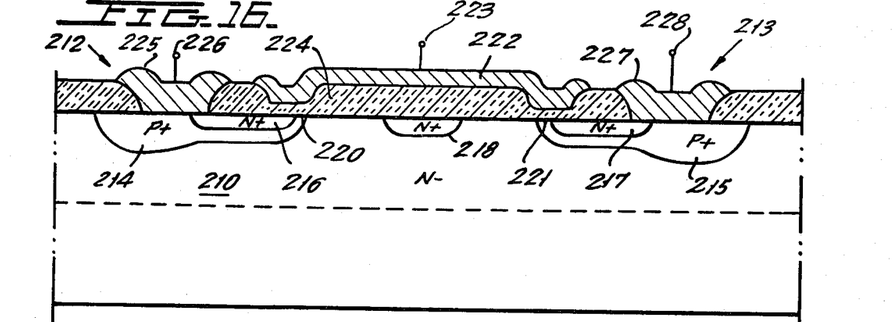
FIG. 16 shows a prior art type of TRIMOS device which is a semiconductor switching device using spaced MOS transistors having a common drain region.

Referring to FIG. 16, the prior art TRIMOS device consists of a substrate region 210 which is of lightly doped N-epitaxially deposited silicon. The lightly doped substrate 210 contains two D-MOS type transistors 212 and 213 which consist of P+ regions 214 and 215, respectively; N+ regions 216 and 217 which are wholly enclosed within the P+ regions 214 and 215, respectively; and a high conductivity N+ type region 218 which is disposed between the two transistors 212 and 213. Regions 214 and 216 define a first conduction channel 220 and regions 215 and 217 define a second conduction channel 221. Channels 220 and 221 can be inverted by the common gate electrode 222 which has a terminal 223 and which is spaced from the upper substrate 210 by the silicon dioxide layer 224. Any suitable insulation layer can be used.

A first main electrode 225, having terminal 226, is then connected to the P+ region 214 and N+ region 216. Electrode 225 may be considered either the source or drain electrode of the transistor 212. The other electrode consists of the body of the substrate 210 disposed between transistors 212 and 213.

Transistor 213 has a main electrode 227 which has a terminal 228. Electrode 227 is connected to the P+ region 215 and the N+ region 217. The N+ regions 216 and 217 define, for example, the source regions of each of transistors 212 and 213. The drain region of each of transistors 212 and 213 is that region of the substate 210 which is disposed between the channels 220 and 221.

The N+ region 218 is disposed between the channels 220 and 221 and beneath the gate 222. The N-substrate could be inverted when suitable voltages are connected to the gate electrode 222. By making the region 218 relatively highly conductive, the region will not be inverted by gate 222.

The operation of the device of FIG. 16 is given in detail in the above-noted U.S. Pat. No. 4,199,774. Briefly stated, for gate potentials above the threshold value, there will be three distinct regions of operation. In the low level region, and if the terminal 228 is less than about 1.5 volts above the potential of terminal 226, both channels 220 and 221 will be inverted and both transistors 212 and 213 will operate in their linear regions. Thus, all anode-to-cathode current will be carried by electrons at the surface of the device. This device will then exhibit low on-resistance current-voltage characteristics similar to that of two short channel D-MOS transistors in series. By way of example, the channel length for channels 220 and 221 may be about 2.5 microns for each.

In an intermediate level of operation, and with an increasing voltage on the terminal 228, the junction between region 215 and substrate 210 becomes forward-biased and serves as the emitter of a wide base PNP lateral transistor. The junction-injected holes will drift and diffuse to the P+ region 214 where they will be collected to contribute an added component to the device current. The result is an increase in transconductance.

As the PNP transistor collector current increases with anode or gate potential, its flow through the resistive region within and extending along P+ region 214 raises the potential of the P+ region beneath the gate 222 and the channel 220 begins to turn on the vertical NPN transistor consisting of regions 216, 214 and 210 which is inherent in the D-MOS structure. This NPN device and the PNP device form a four-layer diode which regeneratively switches when the alphas of the PNP and NPN transistors add up to one. In its on-state then, the TRIMOS device exhibits a dynamic resistance, for example, of less than about 10 ohms and can pass currents of several amperes.

Disadvantages of the device of FIG. 16 include limited reverse voltage withstand capability and the difficulty of manufacturing the device. The reverse voltage limitation is caused by the electric field which expands from P+ region 214 and terminates sharply on the surface of substrate 210 adjacent the beginning of the N+ region 218. Thus, the device tends to break down at about 200 volts reverse voltage.

The device is also hard to make because the N+ region 218 must be formed by a diffusion step and a mask alignment step which are independent of the self-aligned manufacturing techniques used for making the transistors 212 and 213.

Figure 17:
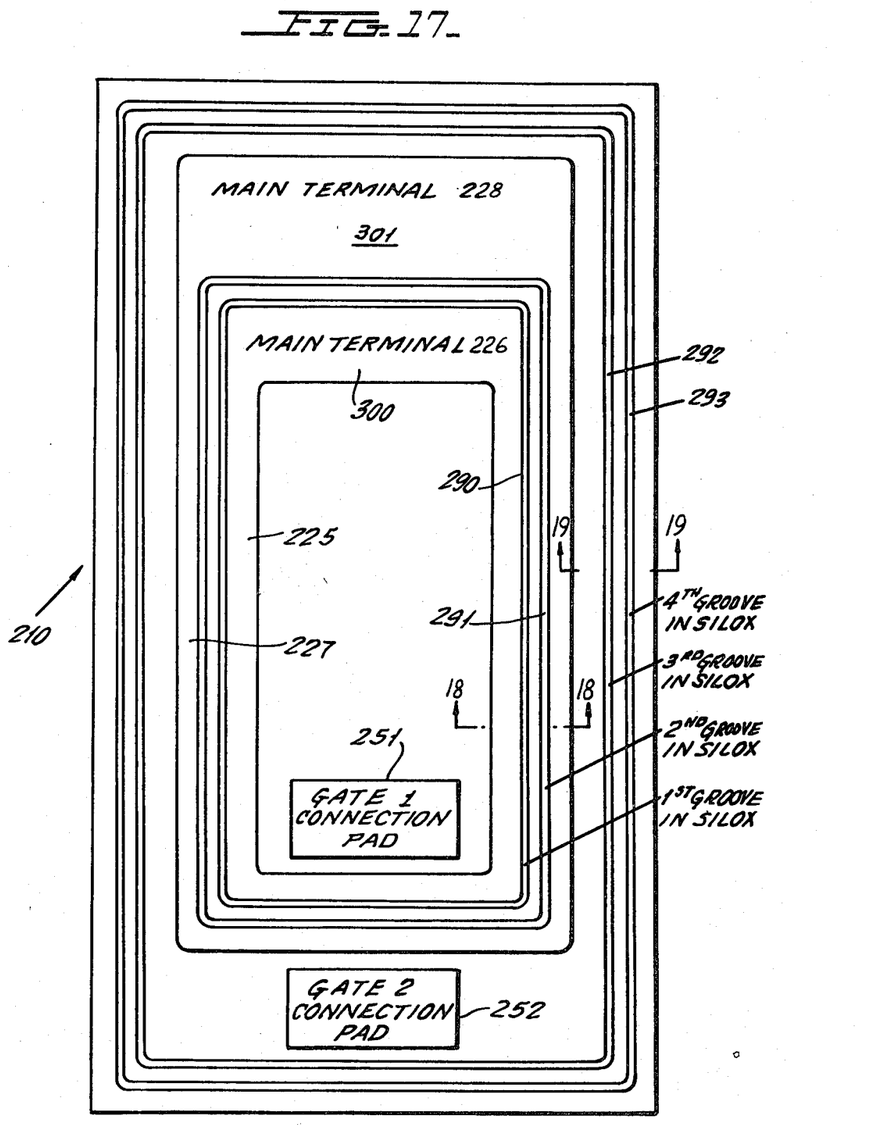
FIG. 17 is a top view of a TRIMOS device which incorporates the feature of the present invention.
Figure 18:
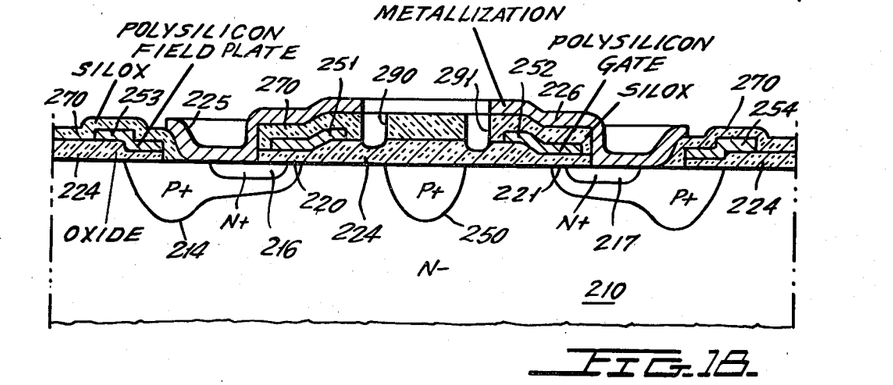
FIG. 18 is a cross-sectional view of FIG. 17 taken across the section line 18—18 in FIG. 17 and illustrates spaced gaps in the silox coating.

A further drawback with the device is that when silox is used to form a glassy covering over the upper surface of the device, the silox would polarize adjacent regions of high lateral stress and thus reduces the maximum reverse voltage of the device. 207,126, referred to above entitled FLOATING GUARD RING FOR TRIMOS DEVICE and as shown in FIGS. 17 and 18, it was found that the centrally located N+ region 218, which was though to be necessary to prevent inversion of the N-substrate 210, caused increased electric field near the surface of the device. Moreover, the device required an additional diffusion and masking step in the manufacturing process.

In accordance with the above application Ser. No. 207,126, the N+ region 218 is replaced by a floating P+ region 250 which can be formed simultaneously with the formation of the P+ regions 214 and 215. Thus, no additional process steps are necessary for the formation of the central region 250 shown in FIG. 18. Moreover, and in accordance with the invention, the novel concept of the cut in the phosphorus-doped silicon oxide to minimize polarization of this layer and the use of a composite field plate are incorporated in the construction of the TRIMOS device.

Main terminals 226 and 228 are clearly shown in FIG. 17 where the TRIMOS configuration is an elongated ring-shaped configuration, with the region 250 extending in the middle of the section and of the ring-shaped configuration of FIG. 17, as will later be more fully described.

A suitable processing system similar to that, for example, disclosed in copending application Ser. No. 178,689 can be used to form the device, whereby the oxide layer 224 receives thereon polysilicon gate sections 251 and 252 which are skewed as shown to have a relatively close spacing to the underlying channels 220 and 221, respectively, and a greater spacing from the surface where they are removed from the channels. At the time the polysilicon gates 251 and 252 are formed, polysilicon field plates 253 and 254 are also formed. The polysilicon field plates 253 and 254 are shown as stepped members to obtain the benefit of minimizing the curvature of electric field within the body 210 of the chip and to increase the spacing of equipotential lines at the surface of the chip.

Figure 19:
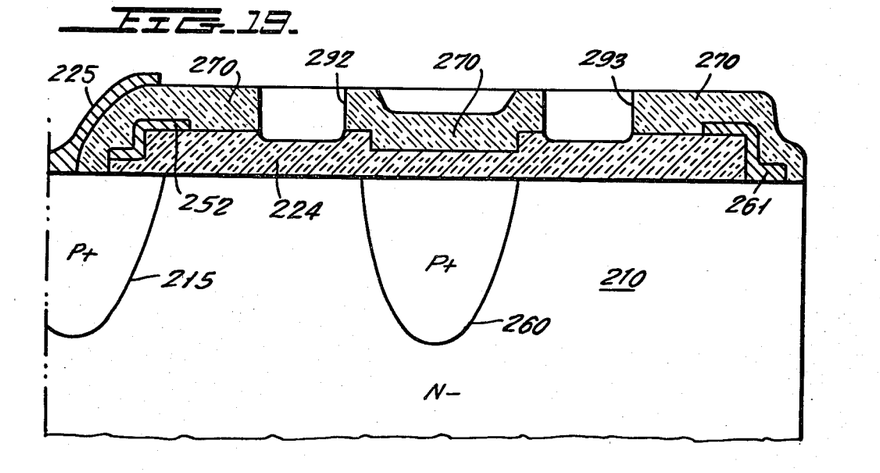
FIG. 19 is a cross-sectional view of FIG. 17 taken across the section line 19—19 and illustrates gaps in the silox layer at the outer periphery of the device on opposite sides of the guard ring.

Note in FIG. 19, which is a cross-sectional view of the outer periphery of the chip, that there is also provided a P+ guard ring 260 which encircles the outer periphery of the chip in the manner of guard ring 161 in FIG. 14 and guard ring 54 in FIG. 9. The outermost periphery of the upper surface of the oxide layer 224 then receives a polysilicon field plate 261 which is connected to the N- substrate 210.

In making the device of FIGS. 17, 18 and 19, it is desirable to coat the upper surface of the device with a silox layer 270. The silox layer is a relatively heavily phosphorus-doped silicon dioxide layer formed over the full surface of the device. As previously discussed, however, this silox layer is polarizable by high lateral electric fields which can interfere with the field distribution within the body of device 210. Thus, in accordance with the invention, first and second ring-shaped cuts 290 and 291 are made through the silox layer and down to the underlying oxide 224 in FIGS. 17 and 18 and on opposite sides of the P+ ring 250. Thus, high voltage, which may appear on either side of the P+ ring 250, will have reduced polarization effects on the silox and thus will cause relatively little effect on the electric field distribution at this area.

In a similar manner, third and fourth cuts 292 and 293, respectively (FIGS. 17 and 19), are made in the silox at the outer periphery of the device and on opposite sides of the guard ring 260. These cuts have the same effect on the polarization of the silox layer as the cuts which have been described previously.

It will also be noted that the arrangement of FIG. 18 employs the benefit of the novel composite plate by virtue of the overlapping relationship between polysilicon gates 251 and 252 and the metallizing 225 and 227, respectively. That is to say, these components define a stepped electrode field insofar as the electric beneath the stepped electrode is concerned. If desired, the metal electrode 225 in FIG. 19 could more completely overlap the silox layer 270 and the field plate 252 to take full advantage of the benefit of the composite polysilicon field plate and metallizing as has been previously described.

In the arrangement shown in FIG. 17, the chip is a rectangular chip which could, for example, have dimensions of 100 mils by 150 mils. It will be observed that main terminal 226 has an enlarged region 300 which can serve as a connection region, while terminal 228 similarly has an enlarged region 301 for connection purposes. Similarly, the gates 251 and 252, which are connected internally of the device in a manner not disclosed in FIG. 17, can be provided with the gate connection pads 251 and 252, respectively, shown in FIG. 17 and located on the surfaces of the chip as shown.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. A semiconductor device having a composite field plate; said semiconductor device comprising a body of semiconductor material having at least a first generally flat surface; at least one P-N junction formed in said first surface and terminating on said first surface wherein said first surface is P type on one side of said P-N junction and N type on the other side of said P-N junction; a first insulation layer on said first surface and extending over at least a part of said P-N junction; a layer of polysilicon of relatively high conductivity having a first body portion galvanically connected to said first surface on only one of said sides of said P-N junction; said layer of polysilicon having a second body portion continuous with said first portion, which said second portion is stepped up from said first surface and overlies and is supported by the upper surface of said first insulation layer; said second body portion terminating on an edge; a second insulation layer extending from an edge overlying said first body portion of said layer of polysilicon and extending to and overlying at least portions of said second body portion of said layer of polysilicon and extending across said edge of said layer of polysilicon; and a contact metal layer overlying said layer of polysilicon and overlying said second insulation layer and extending beyond said edge of said polysilicon; said composite polysilicon and said contact metal layer in surface-to-surface contact with one another only in areas on one side of said edge of said second insulation layer to define a double stepped field plate extending beyond the region of galvanic contact to said first surface by said polysilicon to reduce the curvature of the electric field equipotential lines within said body of semiconductor material during reverse bias of said P-N junction.

2. The device of claim 1, wherein said polysilicon has a thickness of from 0.3 micron to 0.8 micron, said first insulation layer has a thickness of from 0.3 micron to 2.0 microns, and said second insulation layer has a thickness of from 0.3 micron to 2.0 microns.

3. The device of claim 2, wherein said polysilicon layer has a thickness of less than about 50% of the thickness of said first insulation layer.

4. The device of claim 1, 2 or 3, wherein said first insulation layer is silicon dioxide.

5. The device of claim 1, 2 or 3, wherein said second insulation layer is a reflowed silox.

6. The device of claim 4, wherein said second insulation layer is a reflowed silox.

7. The device of claim 1, 2 or 3, wherein said contact metal layer is of aluminum.

8. The device of claim 7, wherein said first insulation layer is silicon dioxide.

9. The device of claim 7, wherein said second insulation layer is a reflowed silox.

10. The device of claim 8, wherein said second insulation layer is a reflowed silox.

11. The device of claim 1, 2 or 3, which further includes a guard ring comprising a second P-N junction diffused into said first surface and surrounding said P-N junction and spaced from and out of contact with said field plate.

12. The device of claim 1, wherein said first insulation layer is silicon dioxide and said second insulation layer is a reflowed silox.

13. The device of claim 1, 2 or 3, wherein said device is a diode.

14. The device of claim 1, 2 or 3, wherein said device is a power metal oxide semiconductor transistor.

15. The device of claim 13, which further includes a guard ring comprising a second P-N junction diffused into said first surface and surrounding said P-N junction and spaced from and out of contact with said field plate.

16. The device of claim 14, which further includes a guard ring comprising a second P-N junction diffused into said first surface and surrounding said P-N junction and spaced from and out of contact with said field plate.

* * * * *